United States Patent
Ueyama

(10) Patent No.: US 9,017,081 B2
(45) Date of Patent: Apr. 28, 2015

(54) SOCKET HAVING A FLOATING PLATE WITH A GUIDE MEMBER AND A BIASING SPRING

(71) Applicant: Enplas Corporation, Kawaguchi-shi (JP)

(72) Inventor: Yuki Ueyama, Kawaguchi (JP)

(73) Assignee: Enplas Corporation, Saitama (JP)

( * ) Notice: Subject to any disclaimer, the term of this patent is extended or adjusted under 35 U.S.C. 154(b) by 48 days.

(21) Appl. No.: 13/713,288

(22) Filed: Dec. 13, 2012

(65) Prior Publication Data
US 2013/0164963 A1   Jun. 27, 2013

(30) Foreign Application Priority Data
Dec. 26, 2011  (JP) .................................. 2011-283504

(51) Int. Cl.
| | |
|---|---|
| H01R 12/00 | (2006.01) |
| H01R 12/70 | (2011.01) |
| H01R 12/50 | (2011.01) |
| H05K 7/10 | (2006.01) |
| H01R 12/52 | (2011.01) |

(52) U.S. Cl.
CPC ........ *H01R 12/7076* (2013.01); *H01R 23/7005* (2013.01); *H01R 12/52* (2013.01); *H05K 7/1061* (2013.01)

(58) Field of Classification Search
CPC ..................................................... H01R 23/75
USPC ................ 439/66–71, 330–331, 700, 842, 74
See application file for complete search history.

(56) References Cited

U.S. PATENT DOCUMENTS

| | | | | |
|---|---|---|---|---|
| 2,427,297 | A * | 9/1947 | Modrey | 439/324 |
| 2,954,543 | A * | 9/1960 | Rayer et al. | 439/248 |
| 5,383,790 | A * | 1/1995 | Kerek et al. | 439/248 |
| 5,534,787 | A * | 7/1996 | Levy | 324/754.09 |
| 5,791,914 | A * | 8/1998 | Loranger et al. | 439/71 |
| 7,544,102 | B2 * | 6/2009 | Oda | 439/700 |
| 7,635,269 | B2 * | 12/2009 | Oda | 439/71 |
| 8,342,872 | B2 * | 1/2013 | Suzuki et al. | 439/331 |
| 8,556,639 | B2 * | 10/2013 | Ueyama | 439/66 |
| 8,562,363 | B2 * | 10/2013 | Kikuchi et al. | 439/157 |
| 8,721,358 | B2 * | 5/2014 | Hayakawa | 439/372 |
| 2012/0058683 | A1 * | 3/2012 | Suzuki et al. | 439/660 |

FOREIGN PATENT DOCUMENTS

JP           2008-53108           3/2008

* cited by examiner

*Primary Examiner* — Chandrika Prasad
(74) *Attorney, Agent, or Firm* — Staas & Halsey LLP

(57) ABSTRACT

A socket for electric part which suppresses a warp of a floating plate caused by the bias power of the spring even if a bending stiffness of the floating plate is low. The socket for electrical part according to a preferred embodiment of the present invention comprises a unit body being located on a interconnection substrate and having through holes into which the contact terminals are inserted, a floating plate holding an IC package and vertically movably supported at the upper part of the socket body, a rivet put in the floating plate to guide a vertical movement of the floating plate, and a spring located between a part of the socket body and the rivet to biases the floating plate upward via the rivet.

5 Claims, 7 Drawing Sheets

SOCKET HAVING A FLOATING PLATE WITH A GUIDE MEMBER AND A BIASING SPRING

BACKGROUND OF THE INVENTION

1. Field of the Invention

The present invention relates to a socket for electric parts comprising a socket body to accommodate a first electric part in a state that the socket body is located on a second electric part and comprising one or more contact terminals located in the socket body to electrically connect the first and second electric parts each other.

2. Background Art

Conventionally, the IC socket, which accommodates the IC package as a "first electrical part" removably, is known as the above-mentioned "socket for electrical parts".

The conventional IC socket comprises a socket body that is made by resin-based material, located on the interconnection substrate as a "second electrical part" and accommodates an IC package. The socket body comprises a frame member and a unit held by the frame member.

A unit disclosed in the Japanese unexamined patent application publication No. 2008-53108 is known as the conventional unit of such kind. The unit of the Japanese unexamined patent application publication No. 2008-53108 comprises a unit body into which contact terminals are inserted and comprises a floating plate, which is used for accommodating the IC package, vertically movably held on the upper part of the unit body via springs.

Such a conventional IC socket has a disadvantage in that a load point at which a bias force of the spring is added (that is, a point at which the repulsive force to the spring occurs) and a supporting point at which the floating plate is supported are not identical to each other when viewed from the upper side. Therefore, there is a possibility that the bias force of the spring will cause a warp of the floating plate if the bending stiffness of the floating plate is low.

If a warp of the floating plate occurs, a seating height and/or a seating plane become unsteady when the IC package is held on the floating plate. And so the capabilities about electrical contact and accommodation of the IC package become worse. Moreover, the warp of the floating plate has a baneful influence on a pushing mechanism (i.e. pusher) for pushing the IC package downward.

SUMMARY OF THE INVENTION

An object of the present invention is to provide a socket for electrical parts in which a warp of a floating plate caused by a bias force of a spring can be suppressed even if a bending stiffness of the floating plate is low.

In order to achieve the object mentioned above, a socket for electric parts according to the present invention comprising a socket body to accommodate a first electric part in a state that the socket body is located on a second electric part and comprising a contact terminal located in a socket body to electrically connect the first and second electric parts: wherein the socket body comprises; a floating plate that is located on the second electric part, has a through hole into which the contact terminal is inserted, holds the first electrical part and is vertically movably supported at the upper part the socket body; a guide member that is put to the floating plate, vertically movably supported in the socket body, and guides a vertical movement of the floating plate, and; a spring that is located between a part of the socket body and the guide member, and biases the floating plate upward via the guide member.

Other feature of the socket for electric parts according to the present invention is that the socket body comprises a frame member and a unit supported by the frame member; the unit comprises a unit body which is located on the second electric part and has a through hole into which the contact terminal is inserted; the floating plate is located at upper part of the unit body, and; the spring is located between a part of the unit body and the guide member.

Other feature of the socket for electric parts according to the present invention is that the unit body comprises plural plates, and; the guide member is vertically movably supported by upper two plates of the plural plates, and comprises a flange member to regulate a uppermost position of the floating plate by contacting with the lower surface of the lower positioned plate of the upper two plate.

Other feature of the socket for electric parts according to the present invention is that the unit body comprises three or more plates, and; the spring is located between a plate positioned lower than the upper two plates and the guide member.

Another feature of the socket for electric parts according to the present invention is that the socket for electrical parts is constructed so that a load point, at which the bias power of the spring is loaded, is substantially identical with a supporting point at which the floating plate is supported by the guide member in a planar view.

According to the present invention, it becomes easier to construct a socket for electric parts having a load point, at which the bias power of spring is loaded, that is substantially identical with a supporting point, at which the floating plate is supported by the guide member in a planar view. Therefore, the present invention can provide a socket for electric part that can suppress a warp of a floating plate caused by the bias power of the spring even if a bending stiffness of the floating plate is low.

As a result, in a socket for electric parts according to the present invention, a seating height and/or a seating plane are steady when the IC package is held on the floating plate. Therefore, capabilities about electrical contact and accommodation of the IC package can improve, moreover, a baneful influence on a pushing mechanism for pushing the IC package downward can be prevented.

According to other feature of the present invention, because of supporting the guide member by two plates, a leaning of the guide member is difficult to occur when the floating plate moves vertically, and so a guide function of guide member can be exercised sufficiently.

According to another feature of the present invention, because the unit body is constructed using three or more plates, by supporting the guide member using the upper two plates and locating the spring between a plate positioned lower than the upper two plates and the guide member, the load point can be substantially identical with the supporting point and the guide member can be difficult to lean, by a simple structure.

BRIEF DESCRIPTION OF THE DRAWINGS

Other objects and purposes of the present invention are described with referencing following attached drawings.

DETAILED DESCRIPTION

Figure 1:
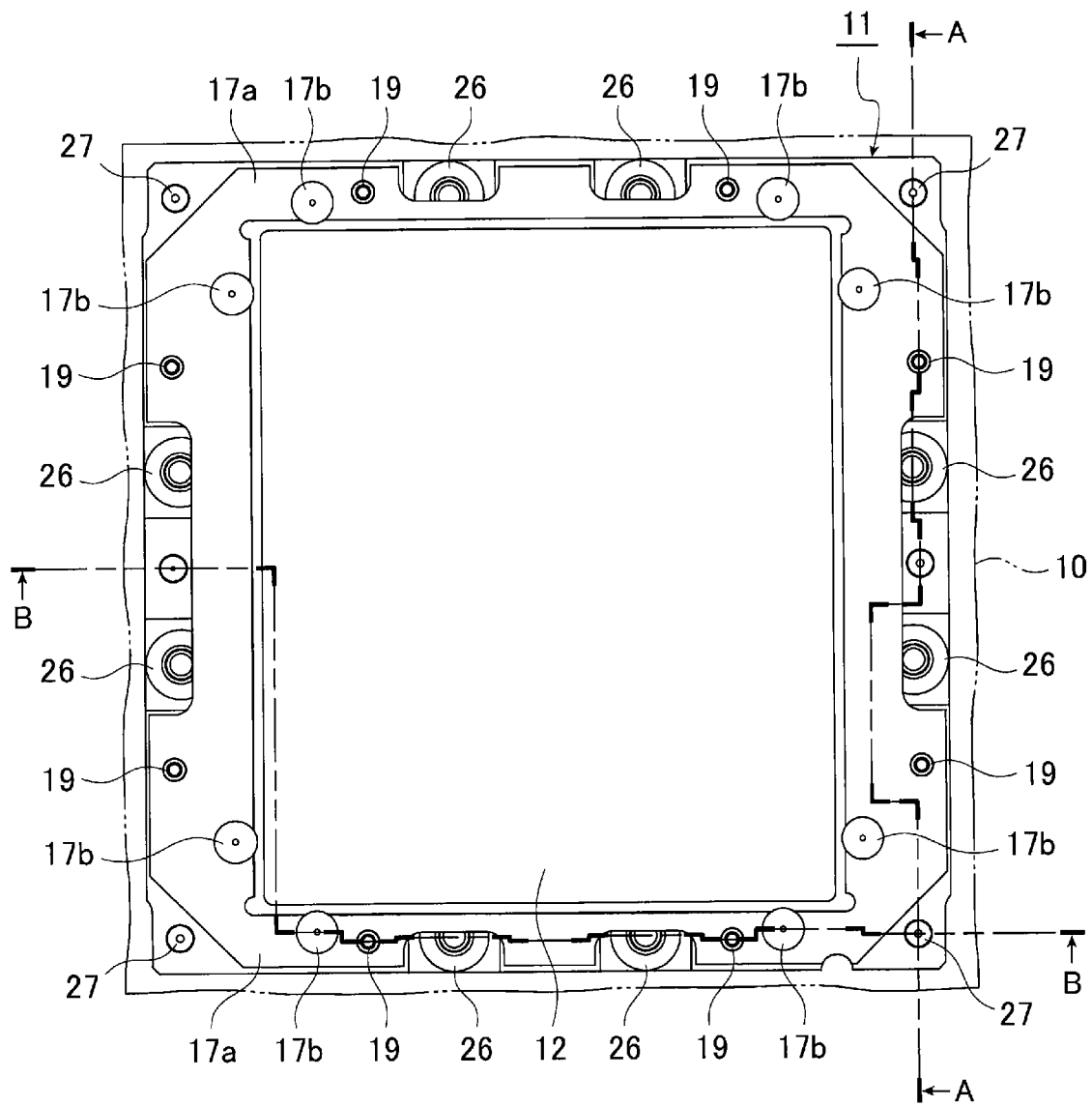
FIG. 1 is a plan view showing a structure of a unit of an IC socket according to a first embodiment of the present invention in a state that an IC package is accommodated to the IC socket.

Hereinafter, preferred embodiments of the present invention are described with referencing drawings.

First Embodiment

FIGS. 1 to 4 shows a first embodiment of the present invention.

Firstly, the structure of the present embodiment is described. An IC socket as a "socket for electric parts" is formed so as to be located on an interconnection substrate 13 as a "second electric parts", and the IC socket is used for electrically connecting the IC package 12 with the interconnection substrate 13 when a burn-in test and so on are performed. The IC socket, which accommodates the IC package 12, comprises a socket body for being set on the interconnection substrate 13 and a pushing mechanism for pushing the IC package 12 set on the socket body downward.

The socket body is provided with a frame member 10 and a unit (i.e. contact module) 11 held in the frame member 10. Note that the frame member 10 is omitted in FIGS. 2 and 3.

The unit 11 comprises, as shown in FIGS. 1 to 4, a unit body 16 which is set on the interconnection substrate 13 and is provided with a large number of through holes 22a, 23a and 24a for inserting contact terminals (i.e. contact pins) 15, a floating plate 17 which accommodates the IC package 12 and is vertically movably held on the upper part of the unit body 16, rivets 19 as "guide members" which are vertically movably supported by the unit body 16 and guide vertical motions of the floating plate 17, and springs 20 which are set between the unit body 16 and the rivets 19 and bias the floating plate 17 upward via the rivets 19.

Figure 2:
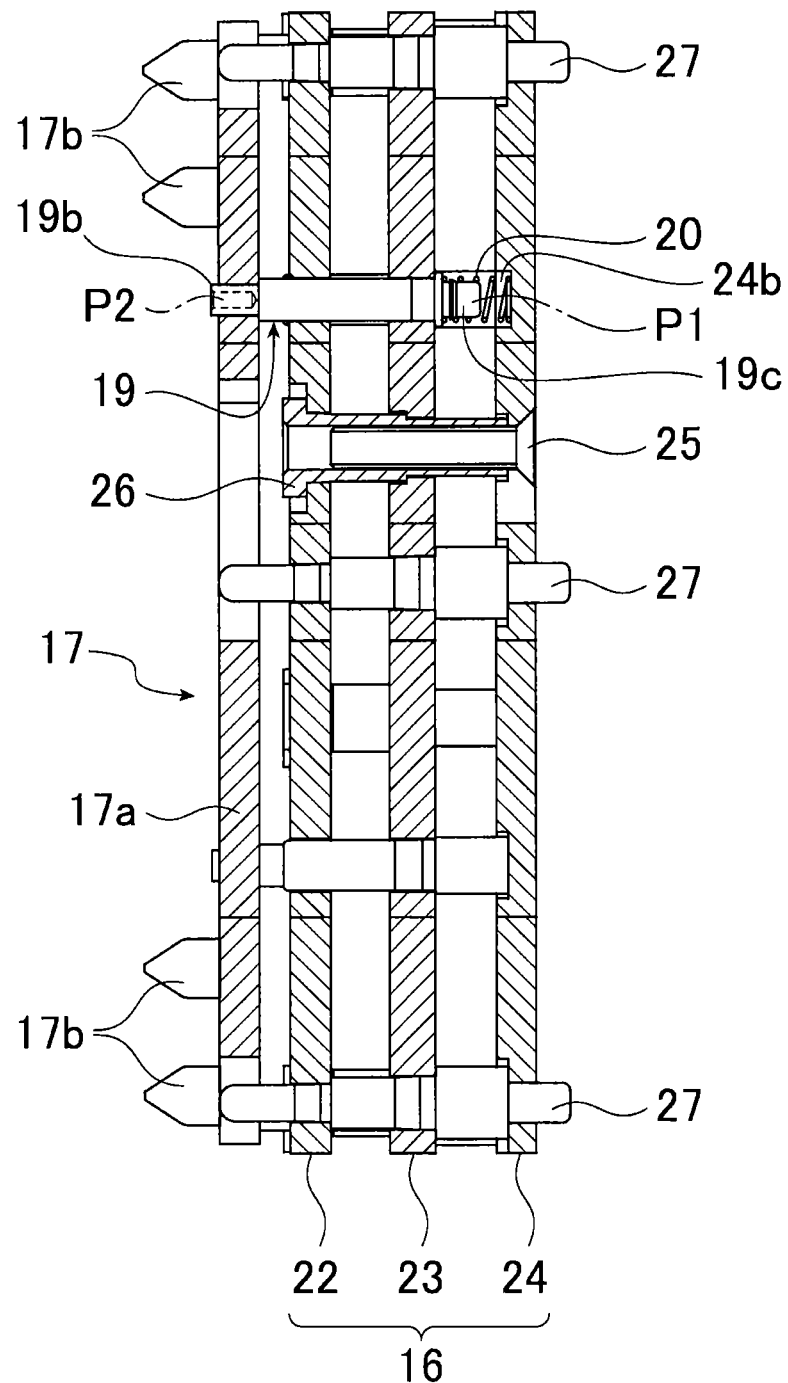
FIG. 2 is a cross-sectional view taken along the line A-A of the unit shown in FIG. 1.
Figure 3:
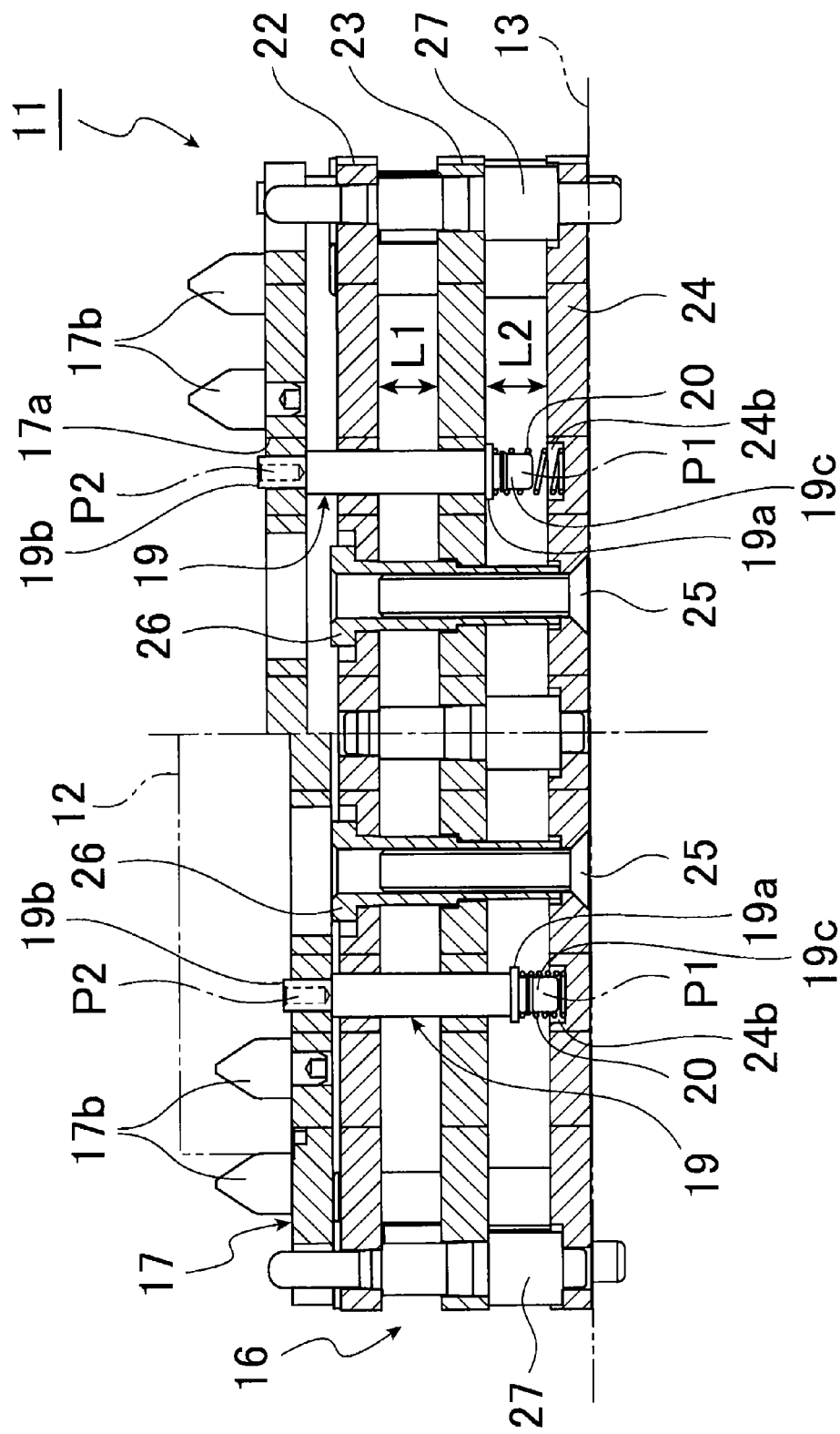
FIG. 3 is a cross-sectional view taken along the line B-B of the unit shown in FIG. 1.

More in detail, the unit body 16 comprises, as shown in FIGS. 2 and 3, an upper plate 22, a middle plate 23 and a lower plate 24 and so on. Three plates 22, 23 and 24 are integrally fixed with keeping predetermined distances L1 and L2 using plural cylindrical step spacers 27 respectively fitted into all of three plates 22, 23 and 24, plural sleeves 26 respectively fitted into the upper and middle plates 22 and 23, and plural bolts 25, the number of which is same as that of the sleeves 26, respectively screwed to the sleeves 26 from a lower surface side of the lower plate 24.

Figure 4:
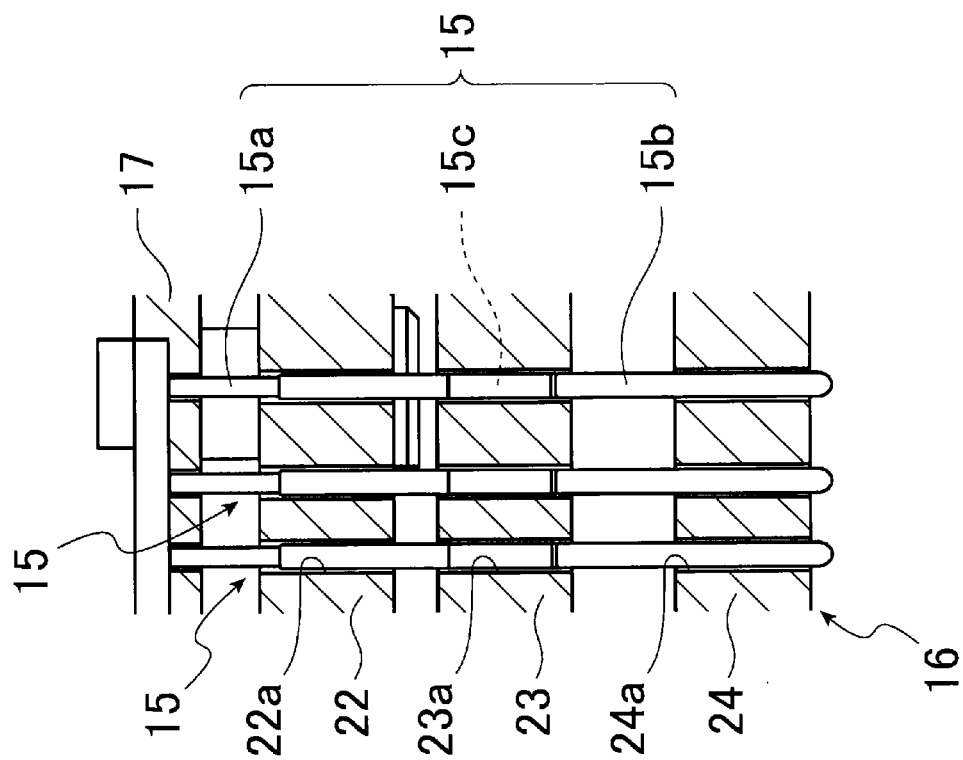
FIG. 4 is an enlarged cross-sectional view showing a relation between the unit of the IC socket and the contact terminals according to the first embodiment.

As shown in FIG. 4, the upper plate 22, the middle plate 23 and the lower plate 24 are respectively provided with a number of vertically-directed through holes 22a, 23a and 24a and the contact terminals 15 are inserted and set into the through holes 22a, 23a and 24a. Each contact terminal 15 has a structure of which a cylindrical step barrel 15a and a rod-shaped plunger 15b are elastically connected each other via a spring 15c.

As shown in FIG. 3, the floating plate 17 is supported vertically movably above the upper plate 22. The floating plate 17 comprises a rectangular frame member 17a. On the frame member 17a, eight chevron guide pins 17b are located.

Moreover, as shown in FIGS. 2 and 3, top edges 19b of eight rivets 19 are fixedly installed to the floating plate 17. The rivets 19 are inserted into and vertically slidably installed to the upper and middle plates 22 and 23. The flange members 19a are formed near the bottom portion of the rivets 19 so as to regulate the uppermost position of the floating plate 17 by contacting with the lower surface of the middle plate 23. The springs 20 are located between the flange members 19a of the rivets 19 and the lower plate 24 as "a part of the socket body" or "a part of the unit body" so as to elastically biases the rivets 19 upward, that is, the direction to approach the floating plate 17. The springs 20 are located between projection portions 19c formed at bottom portions of the rivets 19 and concave portions 24b formed at upper surface of the lower plate 24. Therefore, there is no possibility for the rivets 19 to come off or lean if the rivets 19 move vertically.

As shown in FIGS. 2 and 3, the IC socket of above-mentioned structure has a feature that the load points P1, at which the bias powers of springs 20 are loaded to the rivets 19 installed in the floating plate 17, are substantially identical with the supporting points P2, at which the floating plate 17 is supported at the upper part of the unit body 16 (that is, at which the floating plate 17 is supported by the rivets 19), in a planar view. Therefore, as compared with a conventional IC socket, of which the load points P1 are not identical with the supporting point P2 in a planar view, the bias powers of the springs 20 are made difficult to cause warps of the floating plate 17, even if bending stiffness of the floating plate 17 is low.

Consequently, according to the IC socket of the present embodiment, the bias power of the springs 20 can be set enough large without considering occurring of warps of the floating plate 17, and so the versatility of the unit 11 can expand.

In addition, according to the IC socket of the present embodiment, the floating plate 17 can be thinner. That is to say, the present embodiment can fulfill a demand to make the floating plate 17 thinner, and so can fulfill a demand to make the unit 11 thinner.

In addition, according to the IC socket of present embodiment, the unit 11 does not require a space, because each pairs of the rivets 19 and the springs 20 is located along the same vertical line. Consequently, the present embodiment can improve a space-saving of the IC socket.

Hereinafter, a method for using the IC socket according to the present embodiment is described.

Firstly, the IC socket is set up on the interconnection substrate 13. Then, the plungers 15b of the contact terminals 15 are pushed upward by the interconnection substrate 13, and so the unit 11 rises against the bias power of the spring 15c. As a result, lower end portions of the plungers 15b of the contact terminals 15 are contact with the electrodes (not shown in figures) of the interconnection substrate 13 at the predetermined pressure.

Next, in a situation the floating plate 17 is at the uppermost position, the IC package 12 is held on the floating plate 17. At this time, the IC package 12 is guided by the guide pins 17b of the floating plate 17, and then, peripheral borders of the IC package are supported by the frame member 17a of the floating plate 17.

In such situation, a seating height and/or a seating plane is kept to be steady because occurring of warps of the floating plate caused by bias power of the spring 20 is suppressed as described above. As a result, the capabilities about electrical contact and accommodation of the IC package can be maintained.

Finally, IC package 12 on the floating plate 17 is pushed downward by the pushing mechanism of the IC socket not shown in figures. Then, the floating plate 17 falls to the lowermost position with the IC package 12. Consequently, the barrels 15*a* of the contact terminals 15 are pushed by the IC package 12, and so, the IC socket of the present embodiment falls against the bias powers of the springs 15*c*. Then, the top edges of the barrels 15*a* of the contact terminals 15 contact with the terminals (not shown in figures) of the IC package 12 at the predetermined pressure. As a result, the terminals of the IC package 12 electrically conduct to the electrodes of the interconnection substrate 13 via the contact terminals 15.

In such situation, according to the IC socket of the present embodiment, the pushing mechanism for pushing the IC package 12 downward is possible to prevent a baneful influence because a seating height and/or a seating plane are steady as described above.

Additionally, as shown in FIGS. 2 and 3, the rivets 19 are supported by two plates (that is, the upper plate 22 and the middle plate 23), so the rivets 19 do not lean due to a vertical motion of the floating plate 17. Therefore, the rivets 19 can sufficiently exercise a function as a guide.

In such situation, electric current is supplied to the IC package 12 and a burn-in test or other kind of test is performed.

Second Embodiment

Figure 5:
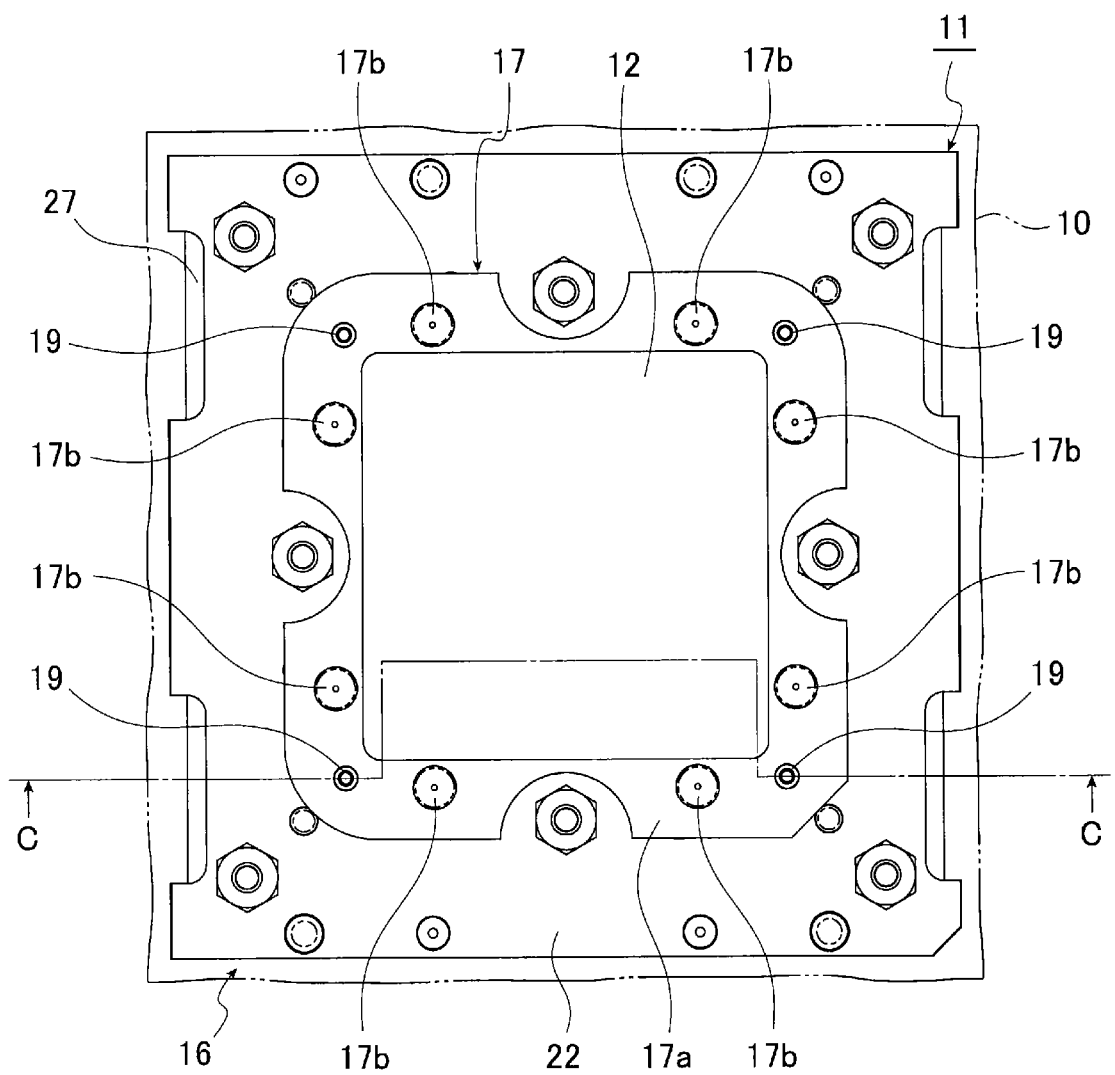
FIG. 5 is a plan view showing a structure of a unit of an IC socket according to a second embodiment of the present invention in a state that an IC package is accommodated to the IC socket.
Figure 6:
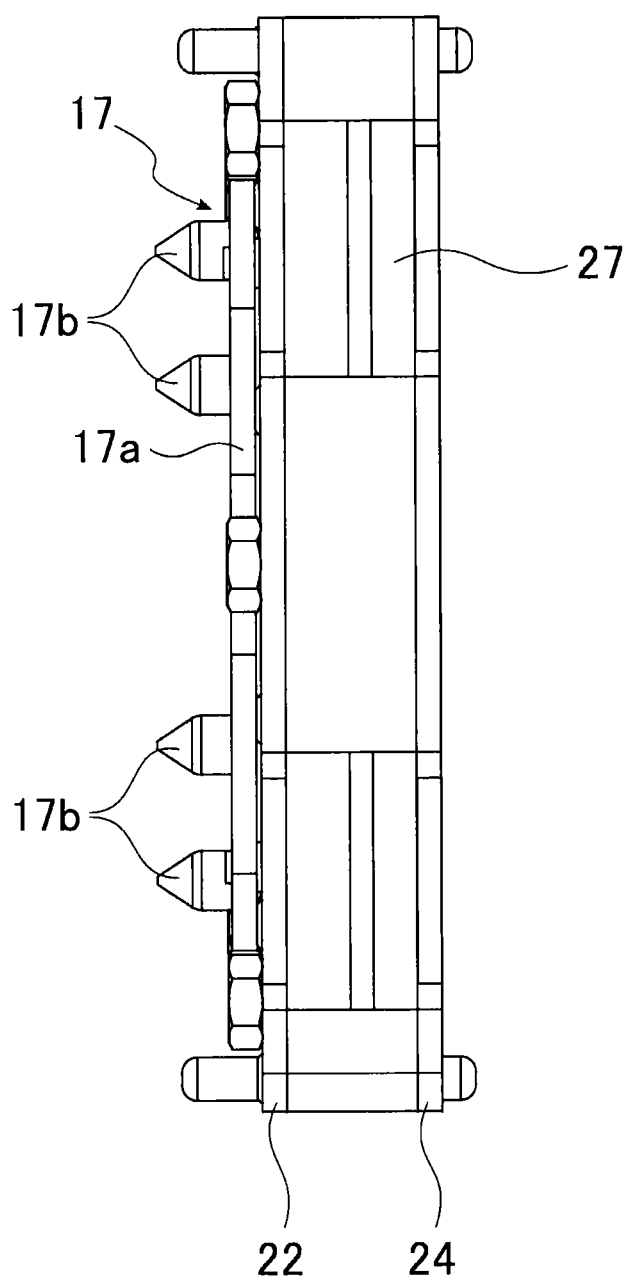
FIG. 6 is a right lateral view of the IC socket according to the second embodiment.
Figure 7:
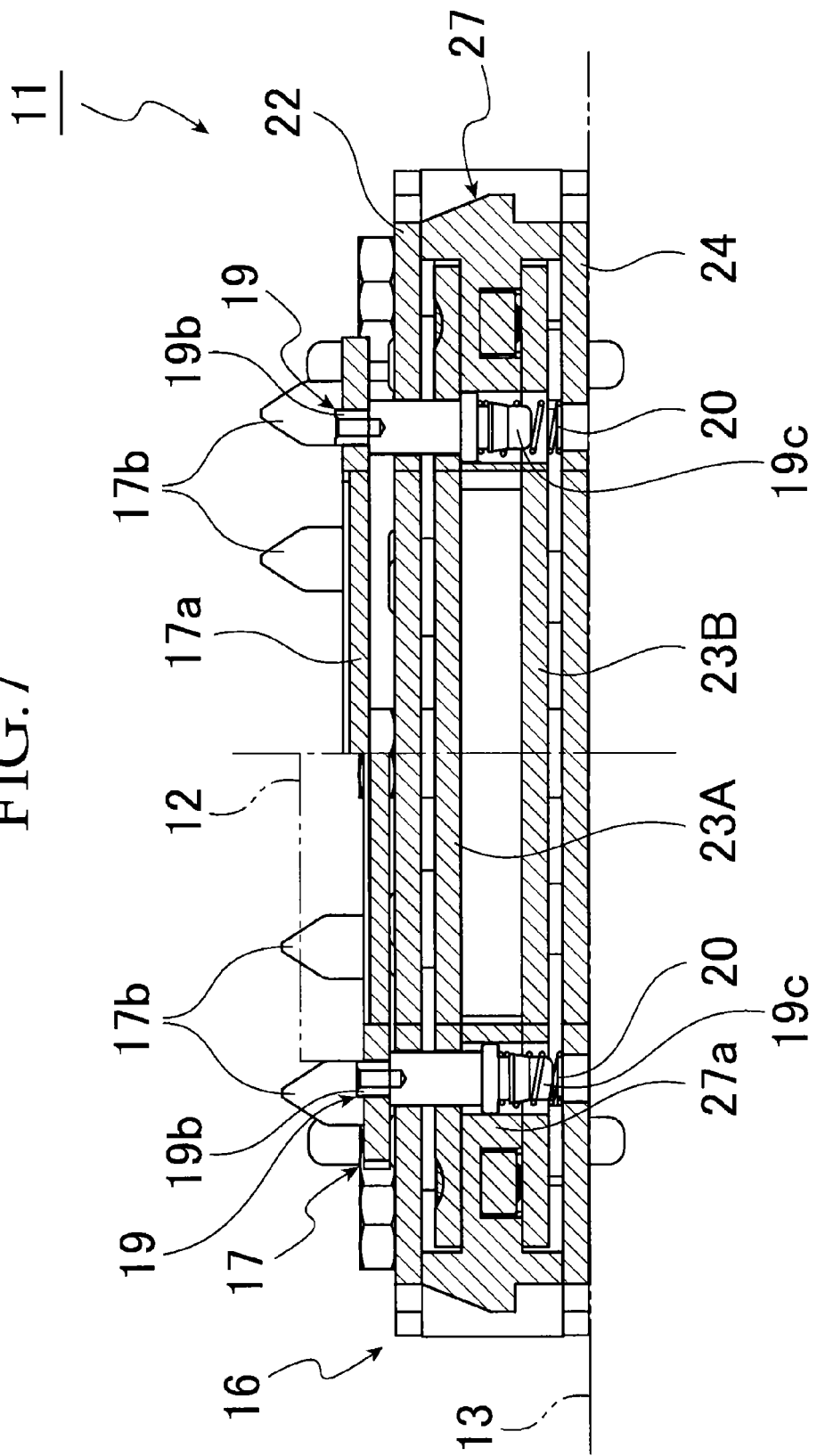
FIG. 7 is a cross-sectional view taken along the line C-C of the unit shown in FIG. 5.

FIGS. 5 to 7 show a second preferred embodiment of the present invention.

The second embodiment has the same structure as the first embodiment except that the number of the plate of the unit body 16 is not three, but four. Note that the same members as those in the first embodiment are denoted by the same reference numerals and that a description thereof will be omitted.

As shown in FIGS. 6 and 7, the unit body 16 according to the present embodiment comprises an upper plate 22, two middle plates 23A, 23B and a lower plate 24 and so forth. These four plates 22, 23A, 23B and 24 are integrally fixed with keeping predetermined distances using a spacer 27 of rectangular frame. The spacer 27 intervenes between the upper plate 22 and the lower plate 24, and comprises a inner projecting piece 27*a*, an upper face and a lower face of which are fixed to the middle plates 23A and 23B. Note that the frame member 10 is omitted in FIG. 5.

As a result, the second embodiment can achieve the same operations and technical advantages as those in the first embodiment.

Other Embodiments

Above-mentioned first embodiment corresponds to an embodiment in which three plates constitute the unit body 16, and above-mentioned second embodiment corresponds to an embodiment in which four plates constitute the unit body 16. Note that the number of plates constituting the unit body 16 is not limited.

In above-mentioned first and second embodiments, the rivets 19 are employed as the guide members. Note that other type of guide member (e.g. closed coil springs) can be employed instead of rivet if it has a function to vertically guide the floating plate 17.

Above mentioned first and second embodiments employ the contact terminals 15, each of which comprise a barrel 15*a*, a rod-shaped plunger 15*b* and a spring 15*c*, however, it is possible to employ other types of contact terminals.

Above mentioned first and second embodiments employ the socket body of which the unit 11 is supported in the frame member 10, however, it is clear that other types of socket bodies can be employed if comprising a floating plate and a spring to bias upward the floating plate.

In above mentioned first and second embodiments, the present invention is applied to the IC socket comprising a pushing mechanism, however, the present invention can be applied to other types of IC sockets. For example, it is clear that the present invention can be applied to an IC socket installed in a system in which a pushing mechanism is put in the automatic machine for serving the IC package to the IC socket. In addition, the present invention can be applied to a socket for electric parts other than the IC socket.

What is claimed is:

1. A socket for electric parts, comprising:
a socket body to accommodate a first electric part in a state that the socket body is located on a second electric part; and
a contact terminal located in the socket body to electrically connect the first and second electric parts,
wherein the socket body comprises:
a floating plate that is located above the second electric part, has a through hole into which the contact terminal is inserted, holds the first electrical part and is vertically movably supported at an upper part of the socket body;
a guide member that is fixed to the floating plate, vertically movably supported in the socket body, and guides a vertical movement of the floating plate, the guide member not being electrically connected with the first electric part or the second electric part; and
a spring that is located between a part of the socket body and the guide member, and biases the floating plate upward via the guide member, and
wherein the guide member comprises a flange member and a projection portion projected below the flange member, the spring is fitted to the projection portion, a lower end portion of the spring is inserted in a concave portion formed at bottom surface of the socket body, the spring makes the projection portion rise such that the flange member makes contact with a part of the socket body and a lower end portion of the projection portion rises to a position higher than an opening of the concave portion by biasing the guide member upward, thereby regulating an uppermost position of the floating plate, and the lower end portion of the projection portion is inserted into the concave portion when the floating plate is pushed downward to a lowermost position of the floating plate.

2. The socket for electric parts according to claim 1, wherein:
the socket body comprises a frame member and a unit supported by the frame member;
the unit comprises a unit body which is located on the second electric part and has a through hole into which the contact terminal is inserted;
the floating plate is located at an upper part of the unit body; and
the spring is located between a part of the unit body and the guide member.

3. The socket for electric parts according to claim 2, wherein:
the unit body comprises plural plates; and
the guide member is vertically movably supported by upper two plates of the plural plates, and the flange member regulates the uppermost position of the floating plate by contacting with a lower surface of a lower positioned plate of the upper two plates.

4. The socket for electric parts according to claim 3, wherein:
the unit body comprises three or more plates; and
the spring is located between a plate positioned lower than the upper two plates and the guide member.

5. The socket for electric parts according to claim 1, wherein a load point, at which a bias power of the spring is loaded, is substantially identical with a supporting point, at which the floating plate is supported by the guide member, in a planar view.

\* \* \* \* \*